United States Patent [19]

Kohman

[11] 4,125,788
[45] Nov. 14, 1978

[54] VOLTAGE LEVEL SHIFTING DEVICE

[75] Inventor: Warren G. Kohman, San Diego, Calif.

[73] Assignee: The United States of America as represented by the Secretary of the Navy, Washington, D.C.

[21] Appl. No.: 801,664

[22] Filed: May 31, 1977

[51] Int. Cl.² .......................... H03K 1/14; H03K 5/00
[52] U.S. Cl. ................................... 307/264; 307/237; 307/255; 307/DIG. 1
[58] Field of Search ............... 307/214, 264, 237, 296, 307/DIG. 1, 262, 254, 255, 313

[56] References Cited
PUBLICATIONS

IBM Technical Disclosure Bulletin, vol. 19, No. 2, Jul. 1976, p. 498, "Level Converter Circuit" by G. J. Gaudenzi et al.

Primary Examiner—John Zazworsky
Attorney, Agent, or Firm—R. S. Sciascia; G. J. Rubens; T. M. Phillips

[57] ABSTRACT

A voltage level shifting device for interfacing systems using positive logic levels and systems using negative logic levels. The circuit is so configured that the output of the device can be connected in parallel with a similar device in wired-OR operation and that a short circuit of the output will not cause excessive current flow, and damaging the circuit components.

5 Claims, 1 Drawing Figure

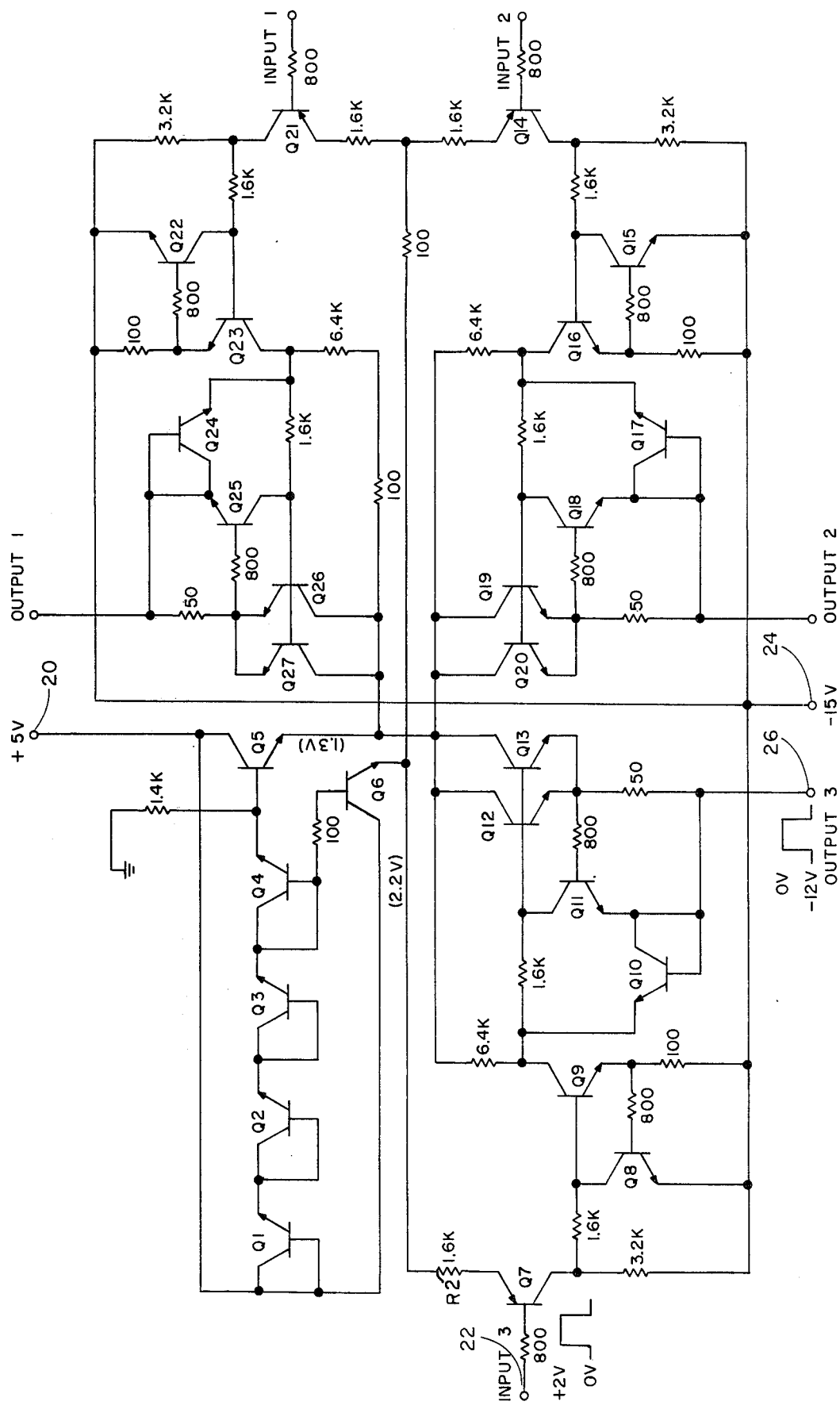

VOLTAGE LEVEL SHIFTING DEVICE

BACKGROUND OF THE INVENTION

Presently there exists a multitude of equipment for communicating with general purpose computers. Each piece of equipment has established specifications for the timing, voltage swings and drive capabilities for communicating with the computers. A problem has arisen since the voltage swings for many interfaces are negative, but the widely used logic family is transistor-transistor-logic (TTL) which uses positive voltages. It is then necessary that the positive logic levels must be shifted to negative logic levels whenever new equipment is designed. Previously, this level shifting was accomplished by using discrete devices such as resistors, capacitors, transistors and diodes assembled by hand on a printed circuit board. This method is costly, requires much manual labor, is complex and requires a relatively large volume for packaging. Also there are no provisions for wired-OR operation and suffer damage when the output is accidently short circuited.

SUMMARY OF THE INVENTION

The present invention performs voltage level shifting required to interface electronic systems using negative voltage logic levels and systems using positive logic voltage levels. Two reference voltages are provided. The first reference voltage is for providing the proper bias to match the switching threshold of the input logic signals. The second reference voltage has a slightly positive value for preventing the output of the level shifter from falling to a negative value in the wired-OR configuration. A negative voltage supply is provided which has a value of approximately the maximum swing voltage of the negative voltage logic level. When the input positive voltage logic signal changes, the transistor circuit is triggered to pull the output to approximately the negative value of the negative supply voltage. Feedback circuit means is provided within the transistor circuit configuration coupled to the negative supply voltage for limiting the current flow in the transistor circuit in the event of a short circuit of the output. This feedback arrangement also allows the outputs of more than one circuit to be connected in parallel in the wired-OR configuration.

Accordingly, an object of the invention is the provision of a level shifting network for shifting positive voltage logic levels to negative voltage logic levels that has effective short circuit protection and has the capability of operating in a wired-OR configuration without requiring modification of the computer.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Referring now to the drawings wherein there is shown in the single figure three identical driver circuits and a voltage regulator circuit which may be formed on a single chip. As shown, there are three inputs and three outputs. To accommodate more inputs two chips may be mounted in a sixteen pin dual-in-line package.

The regulator circuit is comprised of transistors Q1 through Q6 supplied by a +5 voltage source at terminal 20. Voltages are determined by the series of base emitter drops with transistor Q5 and transistor Q6 serving as low impedance current sources. The 2.2 output voltage from transistor Q6 is connected through resistor R2 to the emitter of PNP transistor Q7 to provide a bias so that the threshold of transistor Q7 coincides with the threshold of the TTL gate input at terminal 22. The signal received at terminal 22 would be from the usual peripheral equipment using TTL logic. If the input level at input terminal 22 falls below 1.5 volts, transistor Q7 will conduct and turn on NPN transistor Q9. Transistor Q10 provides a low impedance sink for load current through transistor Q9 to the −15 volt supply at terminal 24. With transistor Q9 conducting, output terminal 26 then falls to a −12 volts.

Transistor Q8 provides a negative feedback from negative supply terminal 24 to the base of transistor Q9 and in the event of a short circuit of output terminal 26 will turn off Q9, thus limiting the current flow through Q9 and provides short circuit protection.

Transistor Q8 also serves to allow the two outputs of similar circuits to be connected in parallel in a wired-OR configuration. If the output at terminal 26 tries to go high, when so connected, the current through transistor Q10 and Q9 would increase by about 4 ma and the negative feedback provided by transistor Q8 would increase the voltage drop across transistor Q9, allowing output terminal 26 to a −0.6 volts.

If the input to transistor Q7 rises above 1.5 volts, Q7 will cease conduct turning off transistor Q9 and the output voltage at terminal 26 will rise to +0.1 volts. Transistors Q12 and Q13 provide a low impedance current path from the 1.3 output voltage of transistor Q5 to the output terminal 26. The 1.3 voltage serves to prevent the output at terminal 26 from falling below −1.0 volt in the wired-OR configuration when one input at terminal 22 is high and the other input is low. Transistor Q11 provides negative feedback and limits the current flow through Q12 and Q13 to provide short circuit protection. Transistors Q12 and Q13 are connected in parallel to further assure that the short circuit current is limited to below the transistor rated current.

The driver circuit consisting of transistors Q14 through Q20 is identical to the driver circuit just described as well as the circuit consisting of transistors 21 through 27. These three circuits are located on one chip and provides three inputs and three outputs.

Obviously many modifications and variations of the present invention are possible in the light of the above teachings. It is therefore to be understood that within the scope of the appended claims the invention may be practiced otherwise than as specifically described.

What is claimed is:

1. A level shifting network for shifting positive voltage logic levels to negative voltage logic levels comprising:
    (a) an input and an output;
    (b) transistor circuit means coupled in circuit with said input and output and being responsive to a positive voltage logic low at said input for providing a negative voltage logic low at said output and being responsive to a positive voltage logic high at said input for providing a negative voltage logic high at said output;
    (c) said transistor circuit means including:
        a power terminal adapted to be connected to a negative voltage source;
        a first reference voltage source;

a first transistor having an emitter connected to said first reference voltage, a base coupled to said input and a collector;

a second reference voltage source;

a second transistor having a collector connected to said second reference voltage, a base connected to the collector of said first transistor and an emitter connected to said power terminal;

a low impedance sink connecting said output to the collector of said second transistor;

a third transistor having an emitter connected to said power terminal, a collector connected to the base of said second transistor and a base coupled to the emitter of said second transistor and being responsive to the transistor current flow in said second transistor for limiting current flow through said second transistor.

2. The level shifting network of claim 1 wherein said low impedance sink is a transistor connected in a diode configuration.

3. The level shifting network of claim 2 further including circuit means connected between said second reference voltage and said output to provide a low impedance path when said input is in a high state.

4. The level shifting network of claim 3 wherein said low impedance path is two transistors connected in parallel.

5. The level shifting network of claim 1 wherein a plurality of said shifting networks are connected in parallel to said reference voltage sources and to said negative voltage source to provide a plurality of inputs and outputs, the number of inputs and outputs being equal to the number of level shifting networks connected in parallel.

* * * * *